US007889545B2

(12) United States Patent
Lee et al.

(10) Patent No.: US 7,889,545 B2
(45) Date of Patent: Feb. 15, 2011

(54) APPARATUS AND METHOD OF NONVOLATILE MEMORY DEVICE HAVING THREE-LEVEL NONVOLATILE MEMORY CELLS

(75) Inventors: Kwang-Jin Lee, Hwaseong-si (KR);
Du-Eung Kim, Yongin-si (KR);
Woo-Yeong Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 133 days.

(21) Appl. No.: 12/187,550

(22) Filed: Aug. 7, 2008

(65) Prior Publication Data
US 2009/0046500 A1 Feb. 19, 2009

(30) Foreign Application Priority Data
Aug. 14, 2007 (KR) ............... 10-2007-0081972

(51) Int. Cl.
*G11C 7/00* (2006.01)
(52) U.S. Cl. ................. 365/163; 365/185.24
(58) Field of Classification Search ............ 365/163, 365/185.24
See application file for complete search history.

(56) References Cited

U.S. PATENT DOCUMENTS

| 4,415,992 | A | * | 11/1983 | Adlhoch | 365/94 |
| 5,163,021 | A | * | 11/1992 | Mehrotra et al. | 365/185.03 |
| 5,485,422 | A | * | 1/1996 | Bauer et al. | 365/185.21 |
| 5,828,616 | A | * | 10/1998 | Bauer et al. | 365/210.12 |
| 6,028,792 | A | * | 2/2000 | Tanaka et al. | 365/185.22 |
| 6,091,631 | A | * | 7/2000 | Kucera et al. | 365/185.03 |
| 6,847,550 | B2 | | 1/2005 | Park | |
| 2002/0145908 | A1 | * | 10/2002 | Tsao | 365/185.12 |
| 2004/0114429 | A1 | * | 6/2004 | Ehiro et al. | 365/158 |
| 2007/0295949 | A1 | * | 12/2007 | Lee | 257/4 |

FOREIGN PATENT DOCUMENTS

| JP | 2006004480 A | 1/2006 |
| KR | 1020070005823 A | 1/2007 |

* cited by examiner

*Primary Examiner*—Michael T Tran
(74) *Attorney, Agent, or Firm*—Volentine & Whitt, PLLC

(57) ABSTRACT

An apparatus and operating method of a nonvolatile memory device having three-level nonvolatile memory cells is used to store more than one bit of data in a nonvolatile memory cell. In addition, the data can be selectively written through a write-verify operation, thereby improving write operation reliability. The operating method includes providing a memory cell array having first through third nonvolatile memory cells where each memory cell is capable of storing one among first data through third data corresponding to first through third resistance levels, respectively. Each of the resistance levels is different from one another. First and the third data are written to the first and third nonvolatile memory cells, respectively, during a first interval of a write operation. Second data is written to the second nonvolatile memory cell during a second interval of the write operation.

30 Claims, 12 Drawing Sheets

FIRST INTERVAL of WRITE OPERATION

SECOND INTERVAL of WRITE OPERATION

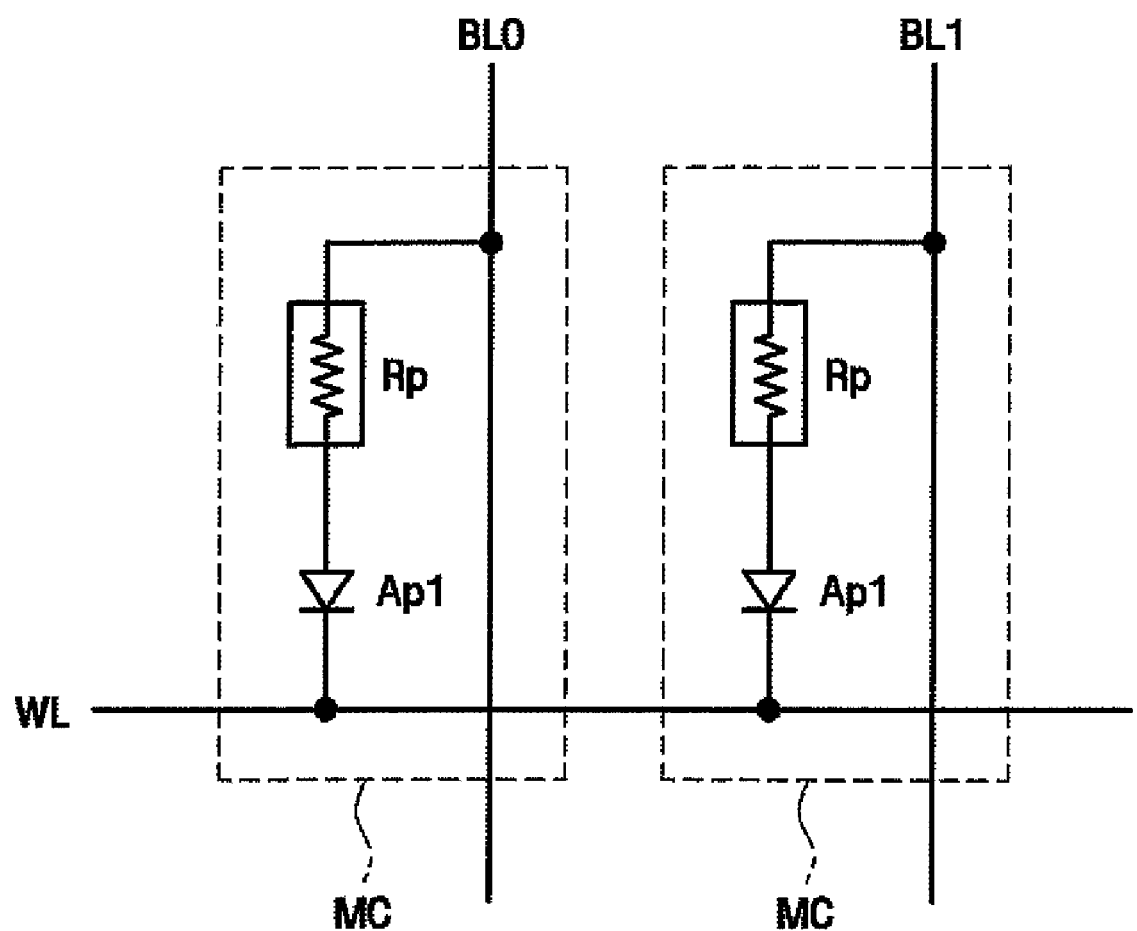

APPARATUS AND METHOD OF NONVOLATILE MEMORY DEVICE HAVING THREE-LEVEL NONVOLATILE MEMORY CELLS

CROSS-REFERENCE TO RELATED APPLICATION

This application claims the benefit of Korean Patent Application No. 10-2007-0081972 filed on Aug. 14, 2007 in the Korean Intellectual Property Office, the disclosure of which is incorporated herein in its entirety by reference.

BACKGROUND OF THE INVENTION

1. Field of the Invention

Embodiments of the invention relate to nonvolatile memory devices. More particularly, embodiments of the invention relate to an apparatus and operating method of a nonvolatile memory device having three-level nonvolatile memory cells.

2. Discussion of Related Art

Next generation nonvolatile memory devices are being developed for use in portable consumer products to provide high capacity and low power consumption. While dynamic RAM (DRAM) and flash memory devices store data by using charge, nonvolatile memory devices utilize resistance material to store data by changing the state of phase-change material. These memory devices include, for example, PRAMs (Phase change Random Access Memory) utilizing phase-change material such as a chalcogenide alloy that can be switched between two states, RRAMs (Resistance Random Access Memory) employing material having a variable resistance characteristic of complex metal oxides, and MRAMs (Magnetic Random Access Memory) utilizing the resistance change of MTJ (Magnetic Tunnel Junction) thin films according to the magnetization state of a ferromagnetic substance. The resistance value is maintained in these devices even when no current or voltage is supplied demonstrating nonvolatile memory characteristics.

Various methods for storing as many bits as possible in a limited wafer space have also been developed. For example, one possible way of fabricating even more nonvolatile memory cells in a limited wafer area is to develop and use more sophisticated lithography methods and apparatuses. Alternatively, the integration degree of a nonvolatile memory device can be increased by storing more than one bit in a memory cell (hereinafter referred to as a multi-level nonvolatile semiconductor memory device).

SUMMARY OF THE INVENTION

Exemplary embodiments of the present invention are directed to an apparatus and operating method of a nonvolatile memory device having three-level nonvolatile memory cells. In an exemplary method, a memory cell array having first through third nonvolatile memory cells where each memory cell is capable of storing one among first through third data corresponding to first through third resistance levels where each resistance level is different from one another. The first data is written in the first nonvolatile memory cell during a first interval of a write operation. The third data is written in the third nonvolatile memory cell during the first interval of the write operation. The second data is written in the second nonvolatile memory cell during a second interval of the write operation.

BRIEF DESCRIPTION OF THE DRAWINGS

FIGS. 6A and 6B are circuit diagrams for explaining phase change memory cells used in phase change memory devices according to embodiments of the present invention;

DESCRIPTION OF EMBODIMENTS

Figure 1:
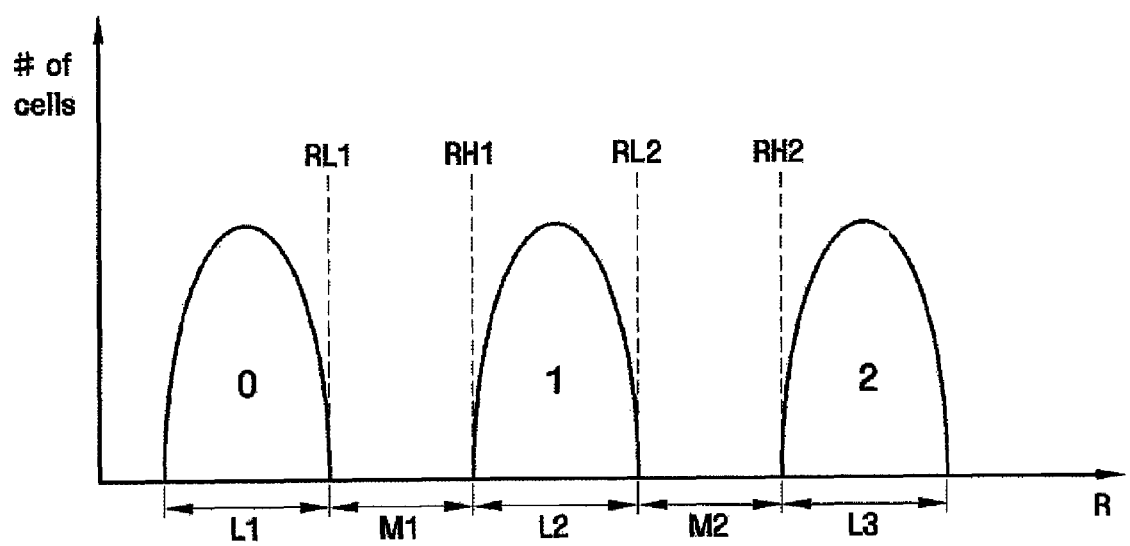
FIG. 1 illustrates resistance levels of nonvolatile memory cells used in nonvolatile memory devices according to embodiments of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. In addition, the thickness of layers and regions shown in the drawings are exaggerated for the purpose of explanation. It will be understood that when an element is referred to as being "connected" or "coupled" to another element, it can be directly connected or coupled to the other element or intervening elements may be present.

FIG. 1 illustrates resistance levels of nonvolatile memory cells in a nonvolatile memory device each storing one of first to third (0, 1, and 2) data. Specifically, the first through third data 0, 1, and 2 correspond to first to third resistance levels L1, L2, and L3 where each resistance level is different. A first resistance level L1 is the lowest level, third resistance level L3 is the highest level, and second resistance level L2 is an intermediate level between level L1 and level L3. First resistance level L1 is lower than a first reference resistance RL1, second resistance level L2 is greater than a second reference resistance RH1 and lower than a third reference resistance RL2, and third resistance level L3 is greater than a fourth reference resistance RH2.

First margin M1 and second margin M2 lie between each of the first to third resistance levels L1, L2, and L3, respectively. That is, first resistance margin M1 is defined between first resistance level L1 and second resistance level L2. Second resistance margin M2 is defined between second resistance level L2 and third resistance level L3. The first and second resistance margins M1 and M2 of the nonvolatile memory cell may be lower than those of a conventional 2-level nonvolatile memory cell. However, first and second resistance margins M1 and M2 may be greater than resistance margins of a 4- or more-level nonvolatile memory cell.

Figure 2:
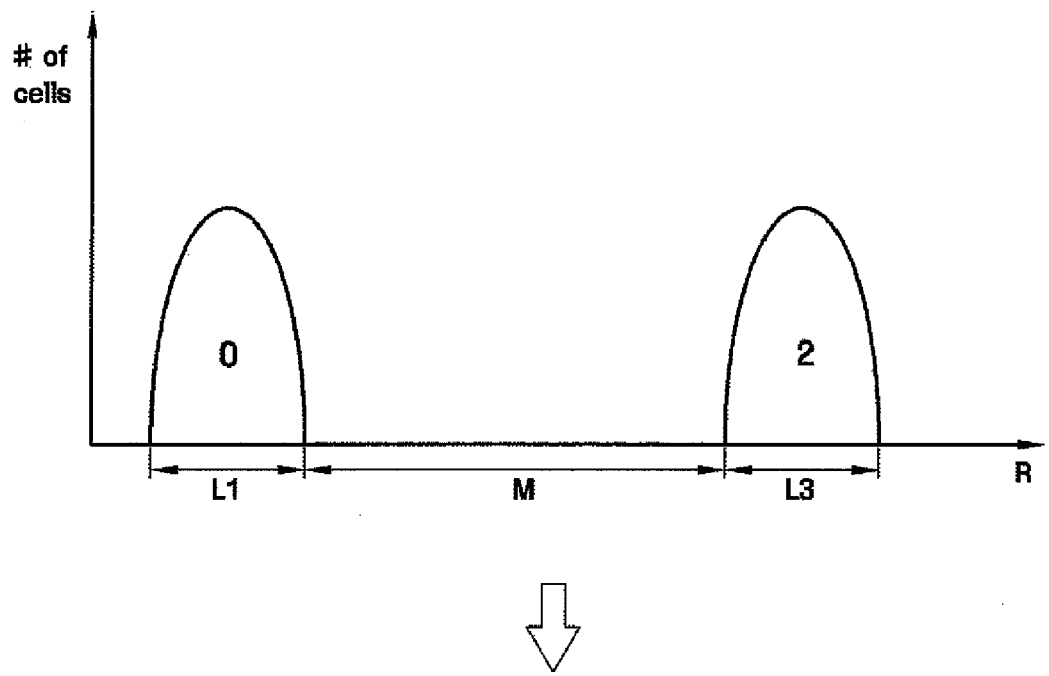
FIG. 2 is a diagram for explaining a write operation of nonvolatile memory cells used in a nonvolatile memory device according to an embodiment of the present invention.
Figure 2:
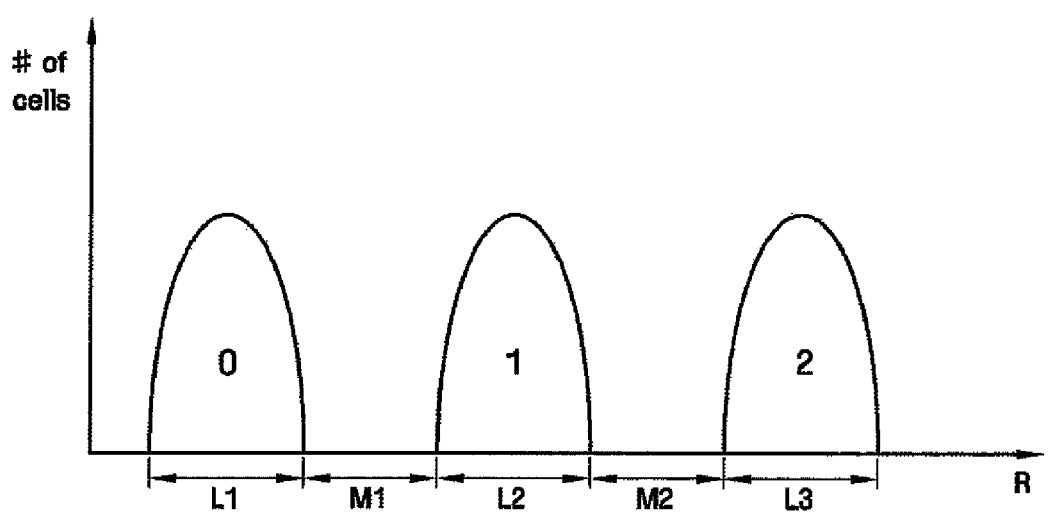

FIG. 2 is a diagram illustrating a write operation of nonvolatile memory cells for two intervals. In particular, during a first interval of the write operation, first data 0 is written to a nonvolatile memory cell (hereinafter referred to as a first nonvolatile memory cell) while third data 2 is written to a nonvolatile memory cell (hereinafter referred to as a third nonvolatile memory cell). During the second interval, second data 1 is written to a nonvolatile memory cell (hereinafter referred to as a second nonvolatile memory cell). During the first interval of the write operation, first data 0 and third data 2 are simultaneously written. It is desirable to maximize the resistance margin M between first resistance level L1 corresponding to first data 0 and third resistance level L3 corresponding to third data 2 such that a greater resistance margin M allows second data 1 to be easily written during the second interval of the write operation.

Figure 3:
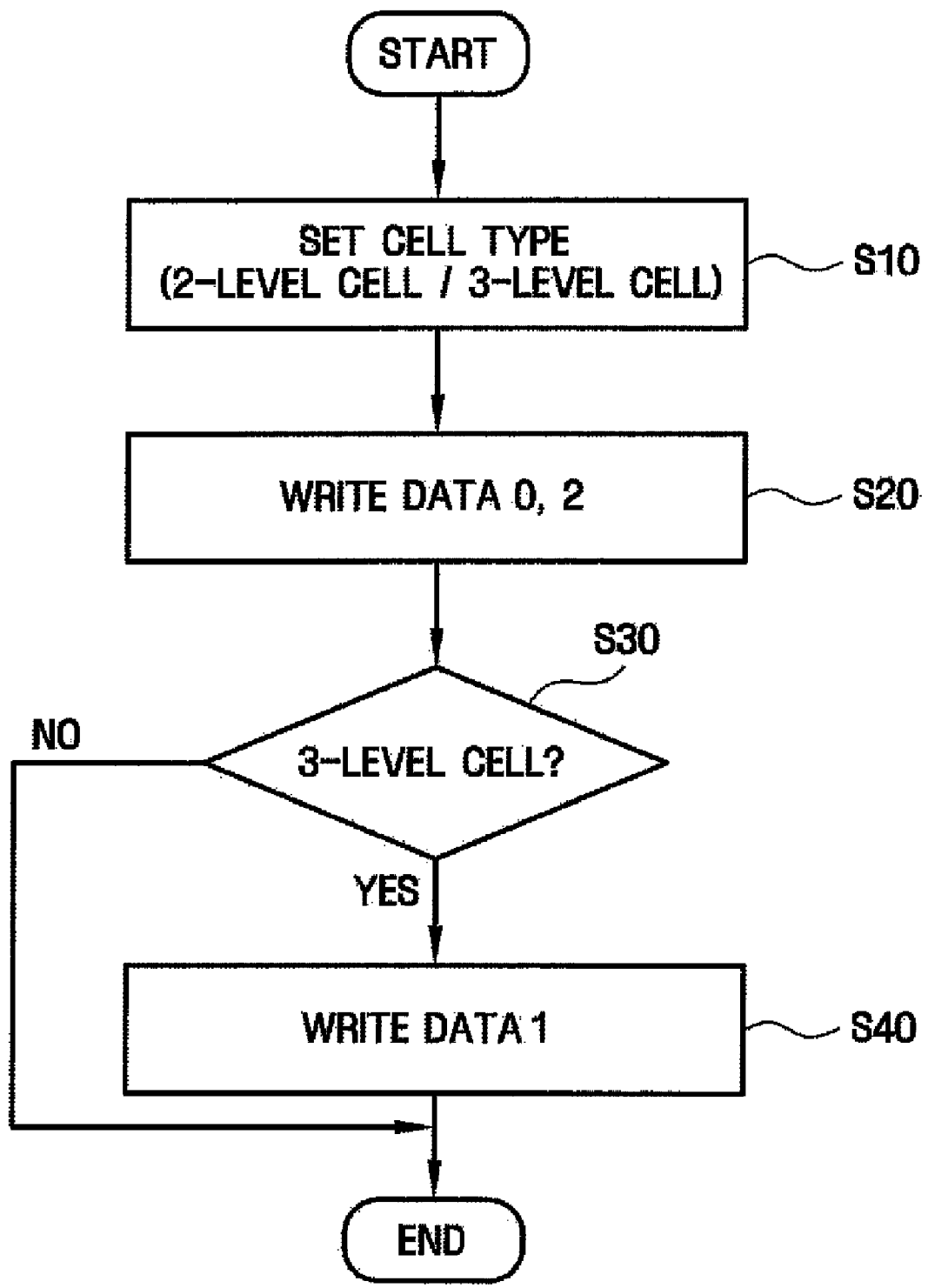
FIG. 3 is a diagram for explaining write operations of nonvolatile memory cells used in a nonvolatile memory device according to another embodiment of the present invention.

FIG. 3 is a diagram illustrating write operations of nonvolatile memory cells for selecting a 2-level nonvolatile memory cell or a 3-level nonvolatile memory cell. For example, when a 2-level nonvolatile memory cell is used, first or third data can be written to the nonvolatile memory cell. When a 3-level nonvolatile memory cell is used, any one of the first data and the third data can be written to the nonvolatile memory cell. If a higher integration degree of a nonvolatile memory device is required, a 3-level nonvolatile memory cell may be used. If a higher operation speed of a nonvolatile memory device is required, a 2-level nonvolatile memory cell may be used. Prior to starting the write operation, a cell type is set in step S10 where it is determined whether each of a plurality of nonvolatile memory cells is used as a 2-level cell or a 3-level cell in the write operation. Once the write operation is started during a first interval, first data 0 is written to a first nonvolatile memory cell while third data 2 is written to a third nonvolatile memory cell S20. Next, when the nonvolatile memory cells are used as 2-level nonvolatile memory cells, the write operation is terminated at step S30. When the nonvolatile memory cells are used as 3-level nonvolatile memory cells, second data 1 is written to a second nonvolatile memory cell during a second interval of the write operation S40. As described above, data can be easily written in a 2-level or 3-level memory cell as determined by a user. When data is to be written in a 2-level memory cell, the write operation is terminated after the first interval. When data is to be written in a 3-level memory cell, the write operation is terminated after the first and second intervals.

Figure 4:
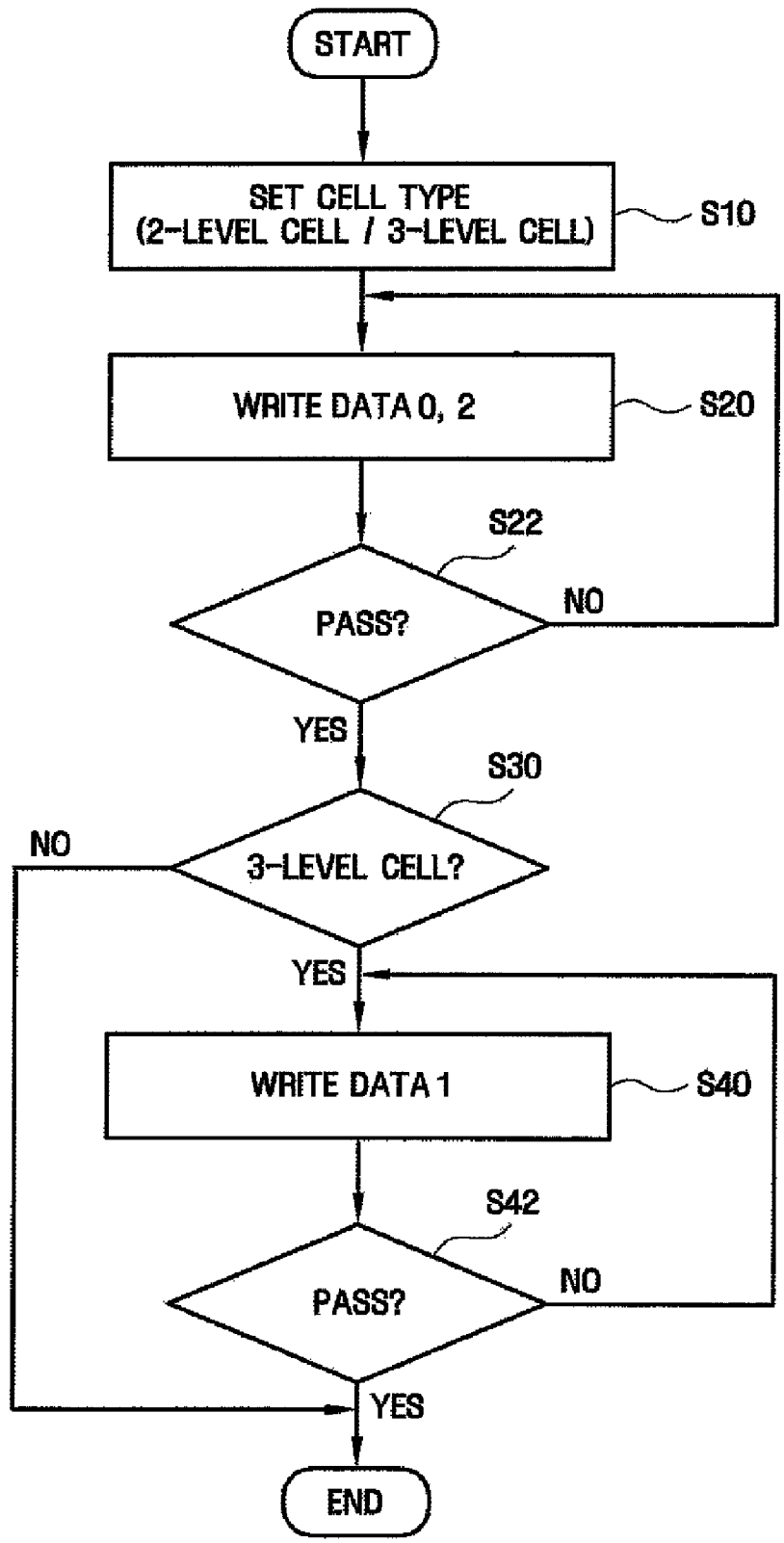
FIG. 4 is a diagram for explaining write operations of nonvolatile memory cells used in a nonvolatile memory device according to still another embodiment of the present invention.

FIG. 4 is a diagram illustrating write operations of nonvolatile memory cells performed through a write-verify operation. During a first interval of the write operation, first data 0 is written to a first nonvolatile memory cell while third data 2 is written to a third nonvolatile memory cell S20. The read-verify operation is performed to determine whether first and third nonvolatile memory cells have been successfully written in step S22. In particular, after writing first data 0, the data stored in the first nonvolatile memory cell is subjected to a read-verify operation to check whether the verify-read data and the third data 2 are equal. If the resistance level of the first nonvolatile memory cell is not within the first resistance level L1, first data 0 is again written to the first nonvolatile memory cell. In the same manner, after writing the third data 2, the data stored in the third nonvolatile memory cell is subjected to a read-verify operation to check whether the verify-read data and third data 2 are equal. If they are not equal, third data 2 is again written to the third nonvolatile memory cell.

While the above embodiment has been illustrated where the first data and the third data are written to the first and third nonvolatile memory cells through write-verify operations, alternative configurations according to a user's needs are also available. For example, only the first data may be written in the first nonvolatile memory cell through a write-verify operation or only the third data may be written in the third nonvolatile memory cell through a write-verify operation.

The second data 1 is written in the second nonvolatile memory cell during the second interval of the write operation in step S40. In step S42, a check is performed to determine whether the data has been accurately written to the second nonvolatile memory cell. That is, after writing second data 1, the data stored in the second nonvolatile memory cell is subjected to a read-verify operation to check whether the verify-read data and the second data 1 are equal. If they are not equal, second data 1 is again written to the second nonvolatile memory cell. When the second data 1 is written to the second nonvolatile memory cell, the write-verify operation is optionally employed based on the need of a user. The writing of data through a write-verify operation may improve the reliability of the write operation while extending the writing time.

Figure 5:
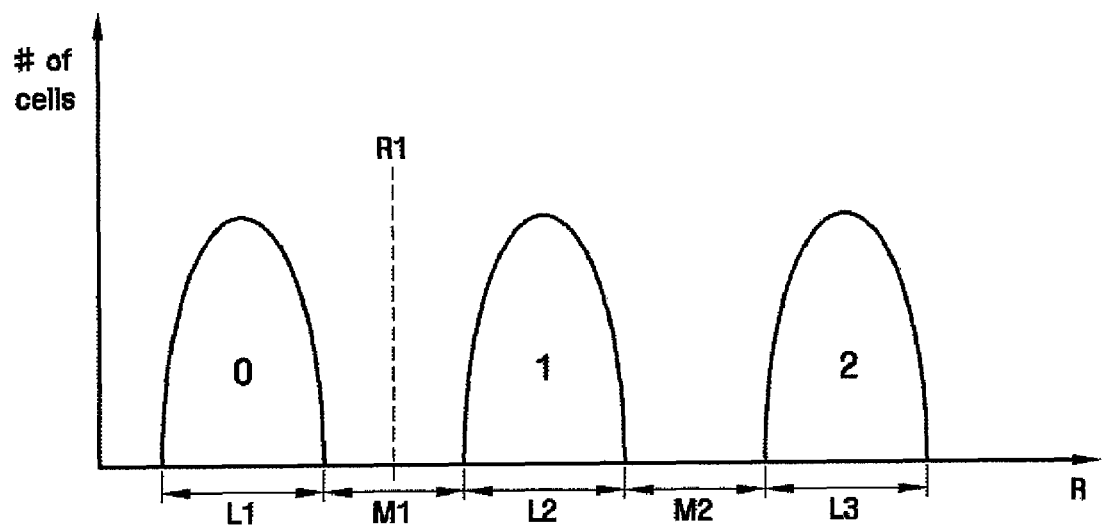
FIG. 5 is a diagram for explaining read operations of nonvolatile memory cells used in a nonvolatile memory device according to an embodiment of the present invention.
Figure 5:
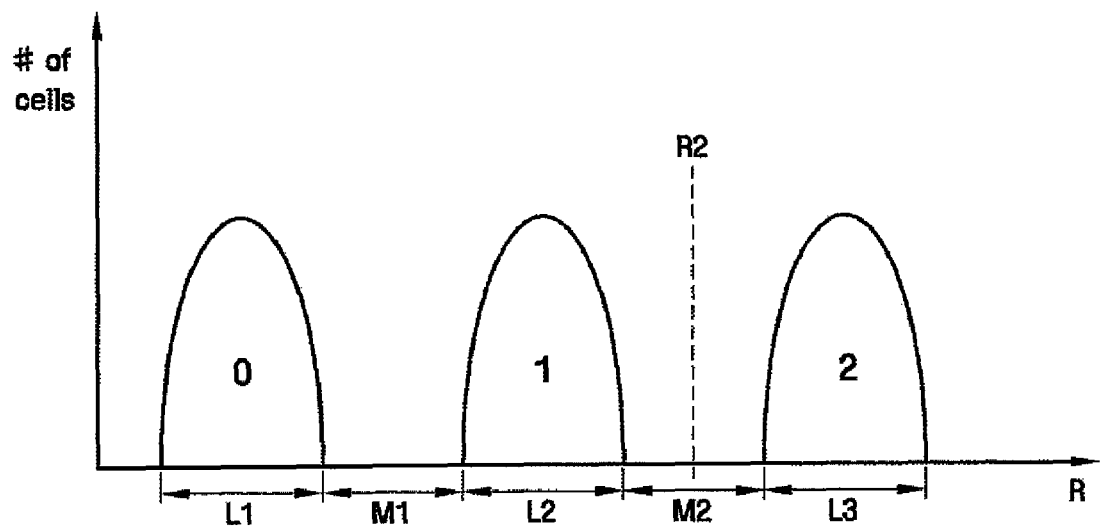

FIG. 5 is a diagram illustrating read operations of nonvolatile memory cells performed for two intervals. During a first interval of the read operation, a check is performed to determine whether data stored in a nonvolatile memory cell to be read is first data 0. A first read current may be provided to the nonvolatile memory cell to be read where the read current may correspond to a resistance level R1 between first resistance level L1 and second resistance level L2. By using this first read current, it is possible to determine whether the data stored in a nonvolatile memory cell to be read is the first data 0 or the second or third data 1, 2.

During a second interval of the read operation, a check is performed to determine whether data stored in a nonvolatile memory cell to be read is third data 2. A second read current may be provided to the nonvolatile memory cell to be read where the read current may be a current corresponding to a resistance level R2 between second resistance level L2 and third resistance level L3. By using this second read current, it is possible to determine whether the data stored in a nonvolatile memory cell to be read is the third data 2 or the first or second data 0, 1. Alternatively, the first read current and the second read current may be reversed. That is, during the first interval of the read operation, the second read current corresponding to the resistance level R2 between second resistance level L2 and third resistance level L3 may be provided, while the first read current corresponding to the resistance level R1 between the first resistance level L1 and the second resistance level L2 may be provided during the second interval of the read operation. Although the above read operation is described with reference to two intervals, the invention is not limited thereto. That is, the read operation may be performed during one interval, rather than two intervals. In this manner, it is possible to simultaneously identify whether the data stored in the nonvolatile memory cell to be read is the first data 0 or the second or third data 1, 2. Unlike in the read operation that is performed using two intervals, it is necessary to use sense amplifiers.

Examples of the write operation and read operation shown in FIGS. 1 through 5 applied to a phase change memory device (PRAM) will be described with reference to FIGS. 6A through 12. Those skilled in the art will appreciate that the write and read operations can be applied to any nonvolatile memory device using a resistance material such as a resistive random access memory device (RRAM), or a ferroelectric random access memory device (FRAM).

Figure 6B:
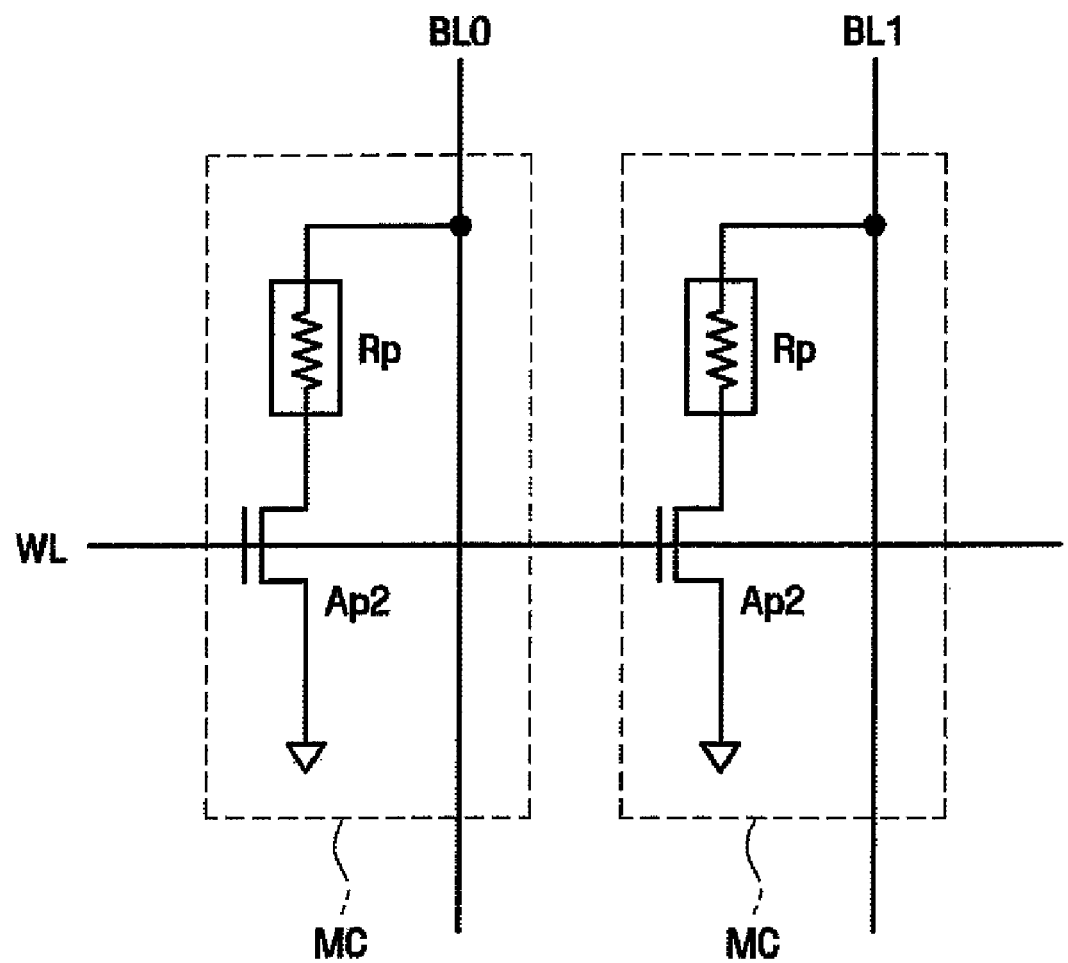

FIGS. 6A and 6B are circuit diagrams illustrating phase change memory cells used in phase change memory devices. Each of the phase change memory cells used in phase change memory device (MC) include a variable resistor Rp and access elements Ap1 and Ap2 controlling the current flowing through the variable resistor Rp. Variable resistor Rp comprises a phase change material having different resistance values depending on whether the phase is in a crystal state or an amorphous state. Here, the access elements Ap1 and Ap2 may be, for example, a diode (Ap1 shown in FIG. 6A) or a transistor (Ap2 FIG. 6B) connected in series with variable resistor Rp. The phase change material may be a two-element compound such as GaSb, InSb, InSe. Sb2Te3, or GeTe, a ternary (three-element) compound such as GeSbTe, GaSeTe, InSbTe, SnSb2Te4, or InSbGe, or a quaternary (four-element) compound such as AgInSbTe, (GeSn)SbTe, GeSb (SeTe), or Te81Ge15Sb2S2. The phase change material is typically GeSbTe made of germanium (Ge), antimony (Sb) and tellurium (Te).

The resistance level of the variable resistor Rp may change according to the amorphous volume of the phase change material in variable resistor Rp. In addition, phase change memory devices are capable of mapping 3-bit external data to two phase change memory cells (MCs), as shown in Table 1. This is because the phase change memory cells (MC) used in the phase change memory devices of the present invention are 3-level phase change memory cells.

TABLE 1

| External data (3 bits) | Internal data (Mapped to two phase change memory cells) | Decimal value |
| --- | --- | --- |
| 000 | 00 | 0 |
| 001 | 01 | 1 |
| 010 | 02 | 2 |
| 011 | 10 | 3 |
| 100 | 11 | 4 |
| 101 | 12 | 5 |
| 110 | 20 | 6 |
| 111 | 21 | 7 |

Figure 7:
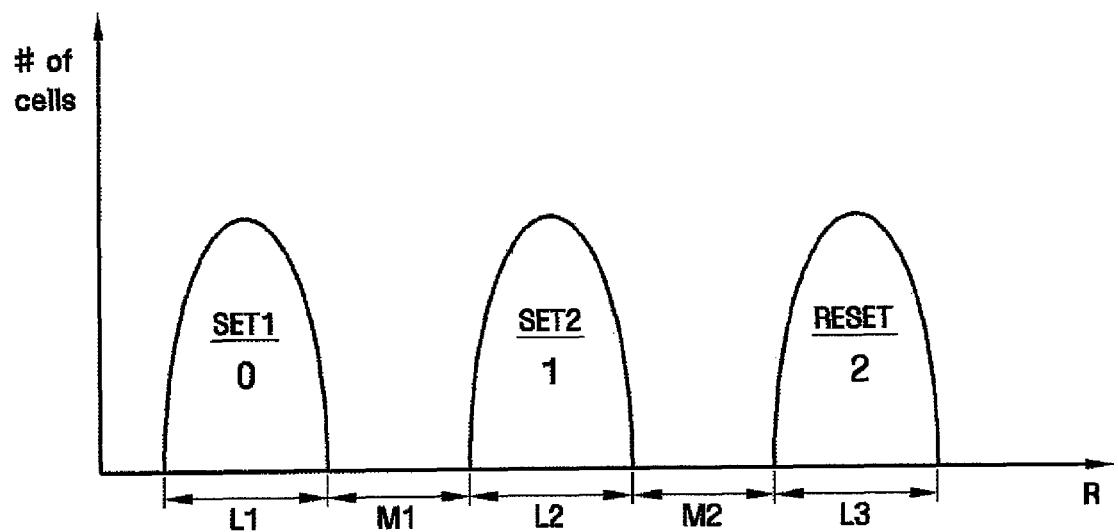
FIG. 7 is a diagram for explaining resistance levels of phase change memory cells used in a phase change memory device according to an embodiment of the present invention and data corresponding to the resistance levels.
Figure 8A:
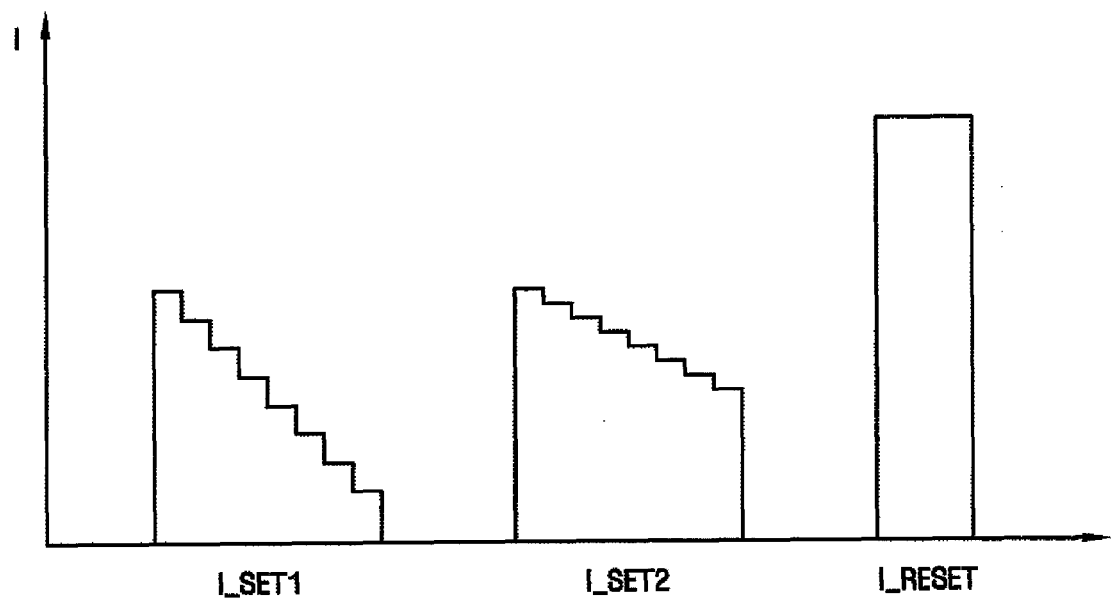
FIGS. 8A through 8C are diagrams illustrating examples of a set current and a reset current provided to the phase change memory cells shown in FIG. 7.
Figure 8B:
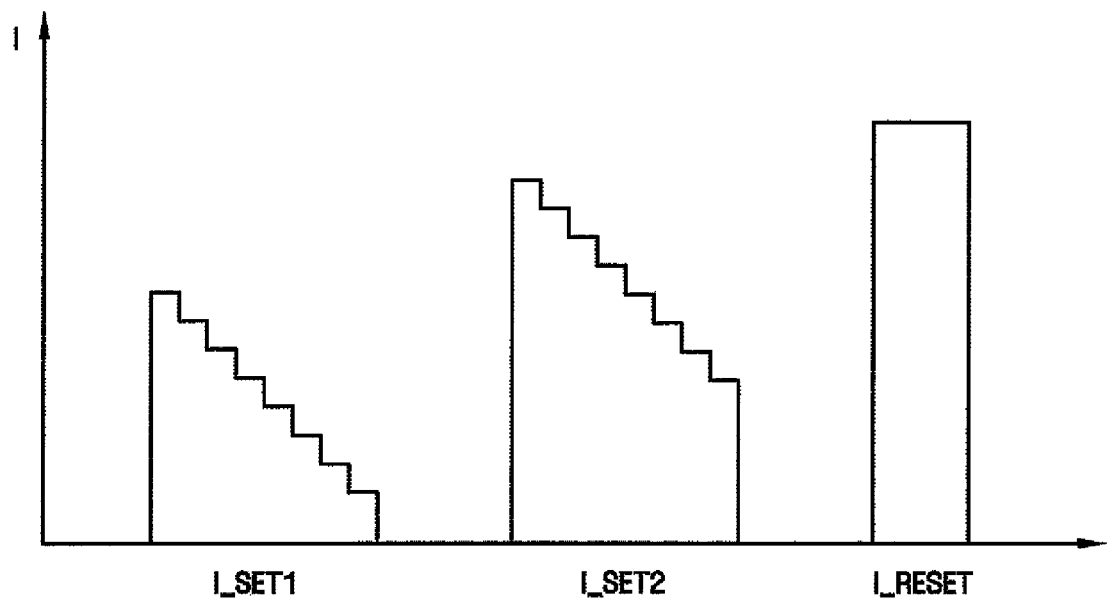
Figure 8C:
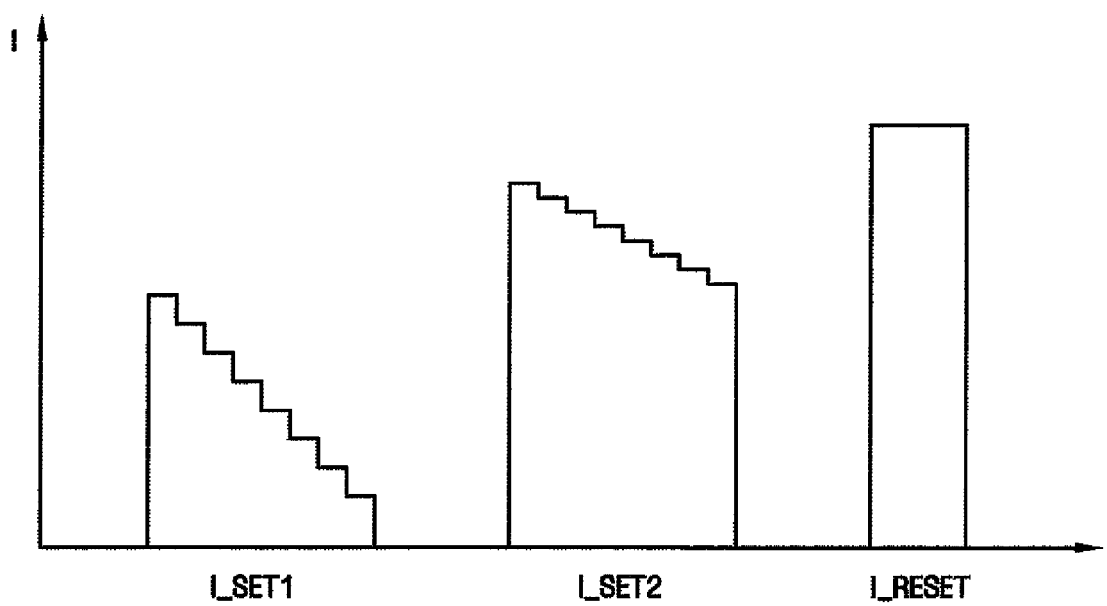

FIG. 7 illustrates resistance levels of phase change memory cells used in a phase change memory device data corresponding to the resistance levels. FIGS. 8A through 8C illustrate examples of a set current and a reset current provided to the phase change memory cells shown in FIG. 7. Referring to FIG. 7, the phase change memory cell may store first set data 0, second set data 1, and reset data 2. First set data 0, second set data 1 and reset data 2 correspond to first through third resistance levels L1, L2 and L3, respectively. Each of the first through third resistance levels L1, L2 and L3 are different and the reset data is used in a single level and the set data is used in multilevels.

The amorphous volume of the phase change material in the variable resistor Rp is smallest in a first resistance level L1 and greatest in third resistance level L3. The amorphous volume of the phase change material in the variable resistor Rp is an intermediate level at the second resistance level L2. A phase change memory is configured to supply a write current for writing set data to phase change memory cells (hereinafter referred to as "set current"), and to supply a write current for writing reset data to phase change memory cells (hereinafter referred to as "reset current"). The set current and the reset current have different shapes. A set current is applied to heat the phase change material below its crystallization temperature. The set current may be shaped to have a plurality of stages sequentially decreasing from a predetermined amount of current. That is, the set current may decrease with a predetermined slope. A reset current is applied to the phase change material above its melting point. The set current is supplied over a predetermined period of time while the reset current is supplied for a relatively short period of time. In other words, the time for writing set data is longer than that for writing reset data.

Examples of the set and reset currents are illustrated in FIGS. 8A through 8C. The amorphous volume of the phase change material may vary according to the initial amount and the slope of the set current I_SET1, I_SET2. Accordingly, as shown in FIG. 8A, the slope of the first set current I_SET1 for writing first set data 0 may be smaller than that of second set current I_SET2 for writing second set data 1. That is, the first set current I_SET1 may have a sharper slope than the second set current I_SET2. In addition, as shown in FIG. 8B, the initial amount of the first set current I_SET1 for writing first set data 0 may be smaller than that of the second set current I_SET2 for writing second set data 1. As shown in FIG. 8C, the initial amount and slope of the first set current I_SET1 for writing first set data 0 may be smaller than those of the second set current I_SET2 for writing second set data 2.

The phase change memory device may use various write operations described with reference to FIGS. 2 through 4 which are summarized in Table 2. However, the write operations in Table 2 are provided only for illustrative purposes and other write operations can be used.

TABLE 2

| Write method | Cell type | First set data (using first interval) | Second set data (using second interval) | Reset data (using first interval) |
| --- | --- | --- | --- | --- |
| 1 | 3-level | No write verify | No write verify | No write verify |
| 2 | 3-level | Write verify | Write verify | No write verify |
| 3 | 3-level | Write verify | Write verify | Write verify |
| 4 | 2-level | No write verify | N/A | No write verify |
| 5 | 2-level | No write verify | N/A | Write verify |
| 6 | 2-level | Write verify | N/A | Write verify |

As shown in Table 2, the phase change memory device simultaneously writes the first set data 0 and the reset data 2 during the first interval of the write operation, and writes second set data 1 during the second interval of the write operation which is the same as described above with reference to FIG. 2. As described above with reference to FIG. 3, the phase change memory cell can be selectively used as a 2-level or 3-level memory cell as determined by a user. In other words, the phase change memory cell may be used as a 3-level phase change memory cell (write method 1, 2, 3), or a 2-level phase change memory cell (write method 4, 5, 6). As described above with reference to FIG. 4, the first data and the second may be written through a write-verify operation. In write methods 1 and 4, the write-verify operation is not used. In contrast, in write method 2 the first set data 0 is written through a write-verify operation during the first interval of the write operation, thereby improving the reliability of the write operation. This can be advantageously used in a case where a writing time for set data is shortened. In write method 3, first set data 0 and reset data 0 are written through a write-verify operation during the first interval of the write operation, thereby significantly improving the reliability compared to write method 2. When a phase change memory cell is used as a 2-level phase change memory cell, as in the write method 5 or 6, reliability can be improved by using a write-verify operation.

The phase change memory device according to embodiments of the present invention can use the various read operations shown in FIG. 5, which are summarized in Table 3. These read operations are provided for illustrative purposes only and alternative read operations may be used.

TABLE 3

| Read operation | First set data | Second set data | Reset data |
|---|---|---|---|
| 1 | First interval of read operation | Second interval of read operation | Second interval of read operation |
| 2 | Second interval of read operation | Second interval of read operation | First interval of read operation |
| 3 | First interval of read operation | First interval of read operation | First interval of read operation |

In read method 1 in Table 3, during a first interval of read operation, a first current corresponding to a resistance level between first resistance level L1 and second resistance level L2 is supplied during a first interval of the read operation while a second current corresponding to a resistance level between second resistance level L2 and third resistance level L3 is supplied during a second interval of the read operation. In this manner, it is possible to determine whether the data stored in a phase change memory cell to be read is first set data 0 during the first interval of the read operation and whether the data stored in a phase change memory cell to be read during the second interval of the read operation is second set data 1 or reset data 0.

In read method 2, the second current corresponding to resistance level between second resistance level L2 and third resistance level L3 is supplied during the first interval of the read operation, while the first current corresponding to the resistance level between first resistance level L1 and second resistance level L2 is supplied during the second interval of the read operation. In this manner, it is possible to determine whether the data stored in a phase change memory cell to be read is reset data 0 during the first interval of the read operation and whether the data stored in a phase change memory cell to be read during the second interval of the read operation is first set data 0 or second set data 1. In read method 3, the read operation may be performed during one interval, rather than two intervals in which case two sense amplifiers are necessary.

Figure 9:
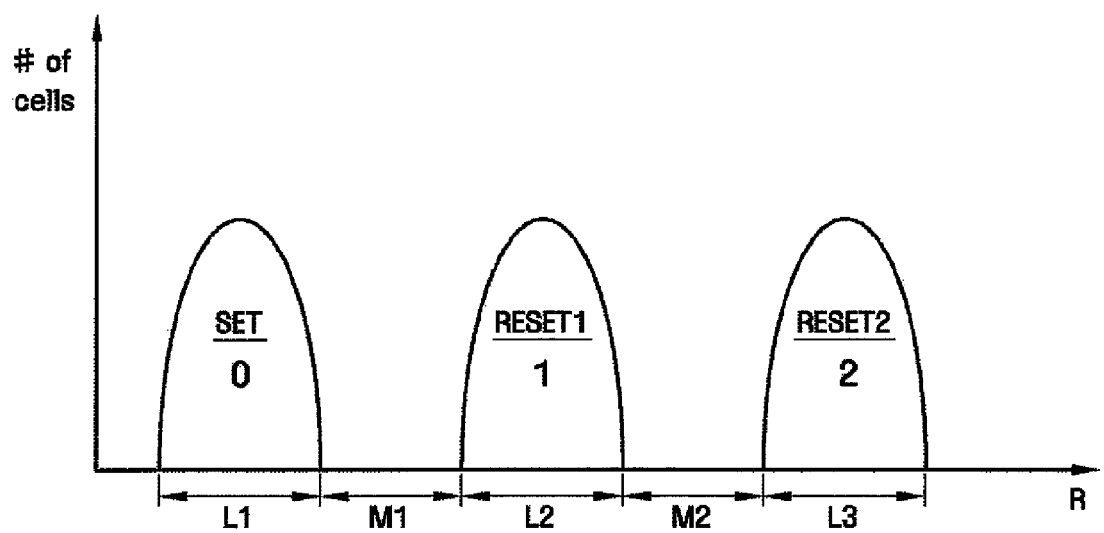
FIG. 9 is a diagram for explaining resistance levels of phase change memory cells used in a phase change memory device according to another embodiment of the present invention, and data corresponding to the resistance levels.
Figure 10:
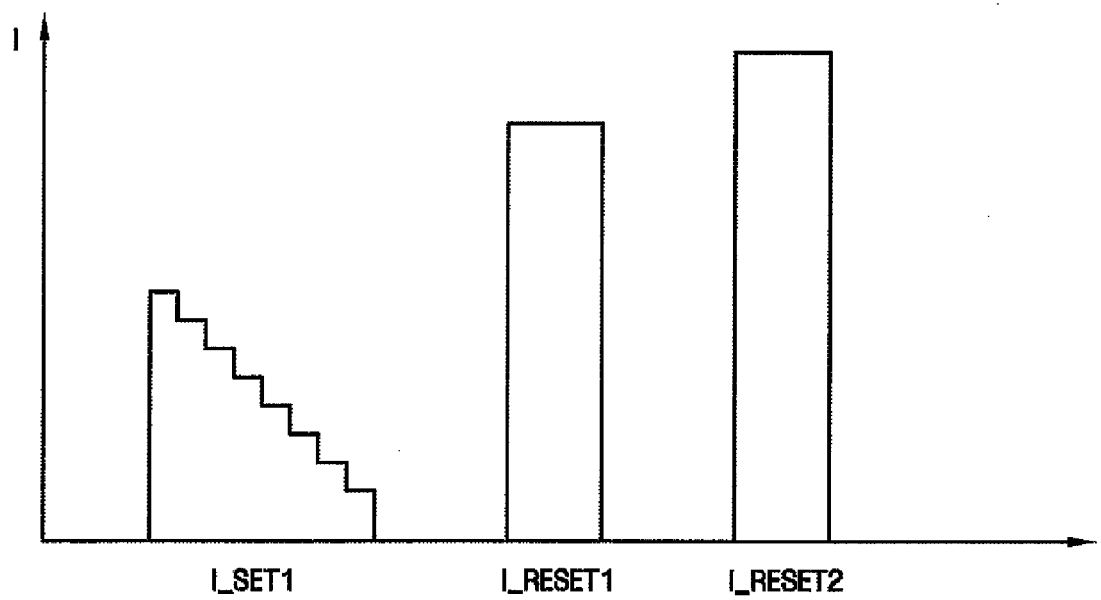
FIG. 10 illustrates examples of a set current and a reset current supplied to the phase change memory cells shown in FIG. 9.

FIG. 9 is a diagram illustrating resistance levels of phase change memory cells and data corresponding to these resistance levels. FIG. 10 illustrates examples of a set current and a reset current supplied to the phase change memory cells shown in FIG. 9. Referring to FIG. 9, the phase change memory cells are capable of storing set data 0, first reset data 1, and second reset data 2. Set data 0, first reset data 1, and second reset data 2 correspond to first through third resistance levels L1, L2, and L3, which are different from one another. In other words, the set data may be used in a single level and the reset data may be used in multilevels. The amorphous volume of the phase change material may vary according to the first current I_RESET1 and reset current I_RESET2. Accordingly, as shown in FIG. 10, the amount of the first reset current I_RESET1 for writing first reset data 1 may be smaller than that of second reset current I_RESET2 required for writing second reset data 2.

The phase change memory device may use various write operations described with reference to FIGS. 2 through 4, which are summarized in Table 4. However, the write operations in Table 2 are provided only for illustrative purposes and other write operations can be used.

TABLE 4

| Write method | Cell type | Set data (Using first interval) | First reset data (Using second interval) | Second reset data (Using first interval) |
|---|---|---|---|---|
| 1 | 3-level | No write verify | No write verify | No write verify |
| 2 | 3-level | No write verify | Write verify | Write verify |
| 3 | 3-level | Write verify | Write verify | Write verify |
| 4 | 2-level | No write verify | N/A | No write verify |
| 5 | 2-level | No write verify | N/A | Write verify |
| 6 | 2-level | Write verify | N/A | Write verify |

As shown in Table 4, the phase change memory device simultaneously writes first set data 0 and reset data 2 during the first interval of the write operation and writes second set data 1 during the second interval of the write operation as described above with reference to FIG. 2. In addition, as described above with reference to FIG. 3, the phase change memory cell can be selectively used as a 2-level or 3-level memory cell according to a user's need. That is, the phase change memory cell may be used as a 3-level phase change memory cell (write method 1, 2, 3), or a 2-level phase change memory cell (write method 4, 5, 6) as shown in Table 4. Each set of data may be written through a write-verify operation based on a user's needs as described above with reference to FIG. 4.

The phase change memory device can use the various read operations shown in FIG. 5 as summarized in Table 5. The read operations in Table 5 are provided only for illustrative purposes and other write operations may be used.

TABLE 5

| Read method | Set data | First reset data | Second reset data |
|---|---|---|---|
| 1 | First interval of the read operation | Second interval of the read operation | Second interval of the read operation |
| 2 | Second interval of the read operation | Second interval of the read operation | First interval of the read operation |
| 3 | First interval of the read operation | First interval of the read operation | First interval of the read operation |

In read method 1, a determination is made whether the data stored in a phase change memory cell to be read is first set data 0 during the first interval of the read operation, and whether the data stored in a phase change memory cell to be read during the second interval of the read operation is first reset data 1 or second reset data 2. In read method 2, a determination is made whether the data stored in a phase change memory cell to be read is second reset data 2 during the first interval of the read operation, and whether the data stored in a phase change memory cell to be read during the second interval of the read operation is first set data 0 or first reset data 1. In read method 3, the read operation may be performed during a block corresponding to one interval, rather than two intervals in which case sense amplifiers are necessary.

Figure 11:
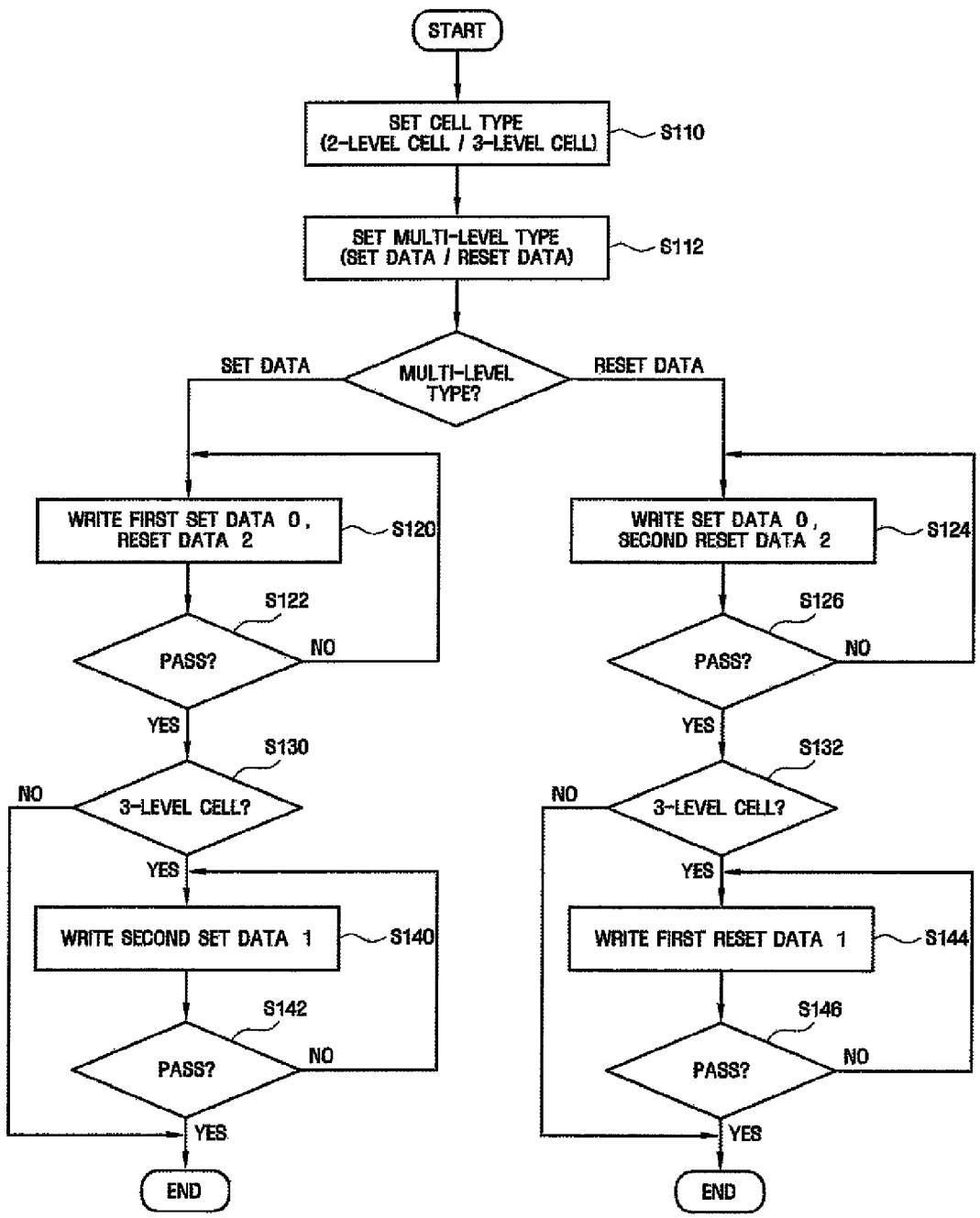
FIG. 11 is a diagram of a phase change memory device according to still another embodiment of the present invention.

FIG. 11 illustrates a phase change memory device having phase change memory cells where the set data may be selectively used in single or in multilevels and the reset data may be used in multilevels. When the set data is used in multilevels, first and second set data correspond to first and second resistance levels L1 and L2, respectively, and the reset data corresponds to a third resistance level L3. When the reset data is used in multilevels, the first set data corresponds to first resistance level L1 and first and second reset data correspond to second and third resistance levels L2 and L3, respectively. Prior to starting the write operation, a cell type is set in step S110 where a determination is made whether each of a plurality of nonvolatile memory cells is used as a 2-level cell or a 3-level cell in the write operation. In step S112, a multi-level type is set in the write operation where a determination is made whether set data or reset data is to be used in multilevels. If the set data is used in multilevels during a first interval of the write operation, first set data 0 is written in a first nonvolatile memory cell while a reset data 2 is written in a third nonvolatile memory cell in step S120. In step S122, a check is performed to determine whether the data has been accurately written in the first and third nonvolatile memory cells. If each of the plurality of nonvolatile memory cells is used as a 2-level memory cell, the write operation is terminated at step S130. If each of the plurality of nonvolatile memory cells is used as a 3-level memory cell, the second set data 1 is written in the second phase change memory cell during the second interval of the write operation in step S140. In step S142, a check is performed to determine whether the data has been accurately written in the second nonvolatile memory cell.

If each of the plurality of nonvolatile memory cells is used as a 3-level memory cell, the write operation is terminated in step S130. In step S124, the first set data 0 is written in the first phase change memory cell while simultaneously writing the second reset data 2 to the third phase change memory cell, during the first interval of the write operation. In step S126, a check is performed to determine whether the data has been accurately written in the first and third nonvolatile memory cells. If each of the plurality of nonvolatile memory cells is used as a 2-level memory cell, the write operation is terminated at step S132. If each of the plurality of nonvolatile memory cells is used as a 3-level memory cell, the first reset data 0 is written in the second phase change memory cell during the second interval of the write operation in step S144. At step S146, a check is performed to determine whether the data has been accurately written in the second phase change memory cell.

Figure 12:
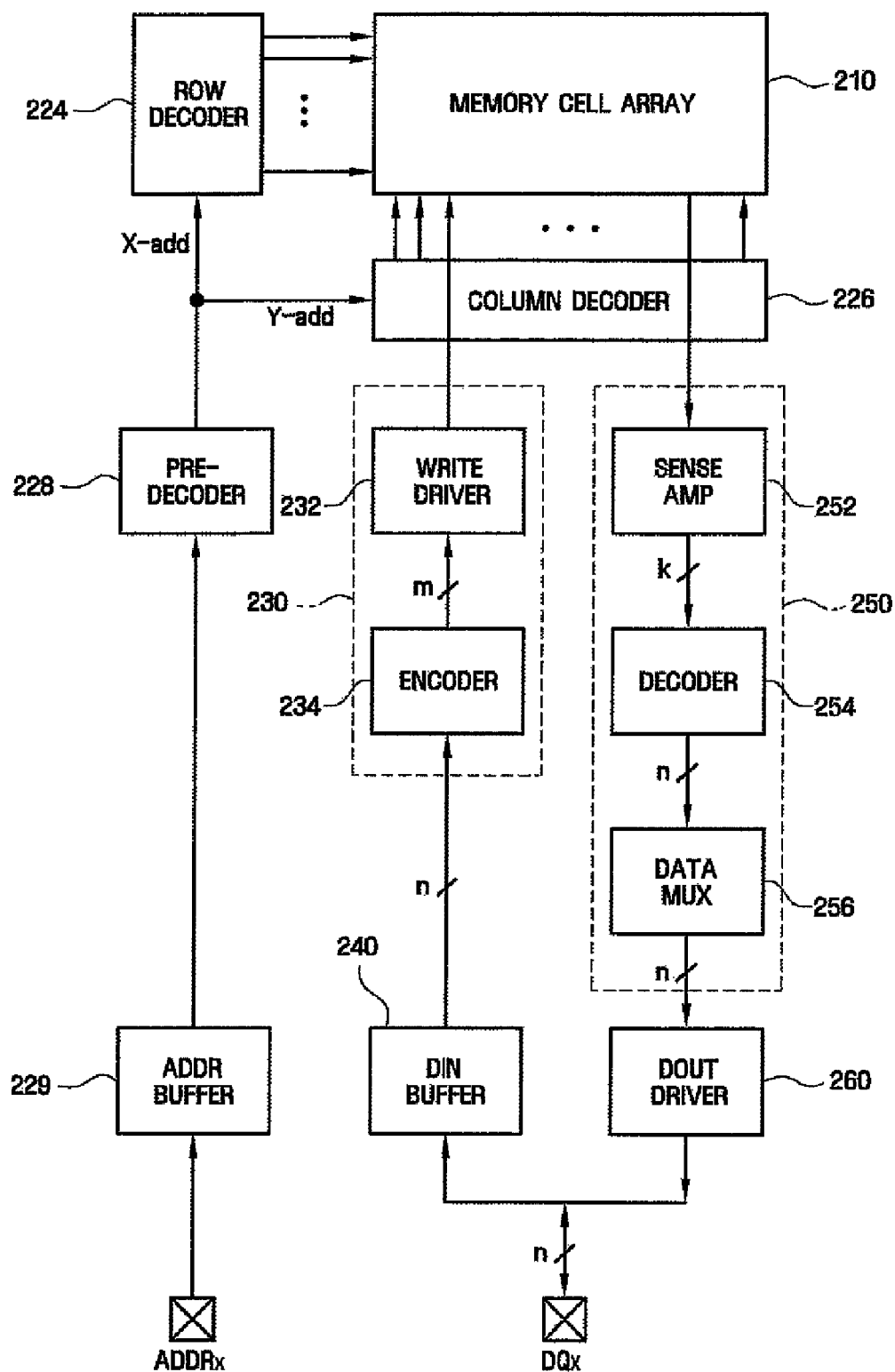
FIG. 12 is a block diagram of one example of phase change memory devices according to embodiments of the present invention.

FIG. 12 is a block diagram of one example of a phase change memory device implementing the write methods and read methods described with reference to FIGS. 6A through 11. Referring to FIG. 12, each of the phase change memory devices include a memory cell array 210, a row decoder 224, a column decoder 226, a predecoder 228, an address buffer 229, a write circuit 230, a data input buffer 240, a read circuit 250, and data output driver 260. Memory cell array 210 includes a plurality of 3-level phase change memory cells. The phase change memory cells may store one from among first through third internal data corresponding to first through third resistance levels, respectively, where the levels are different from each other. The first resistance level is the lowest and third resistance level is the highest level among the three resistance levels. When the set data is used in multilevels, first and second set data are first and second set data, respectively, and the third internal data reset data is reset data. When the reset data is used in multilevels, the first internal data is set data, the second internal data is first reset data, and the third internal data is second reset data.

Row decoder 224 receives row addresses X-add from predecoder 228 and decodes the address to designate rows of the plurality of phase change memory cells. Column decoder 226 receives column addresses Y-add from predecoder 228 and decodes the same to designate columns of the plurality of phase change memory cells. Predecoder 228 receives external addresses Y-add from address buffer 229 and divides the same into row addresses X-add and column addresses Y-add. Write circuit 230 writes first internal data (e.g., first set data) and third internal data on two different nonvolatile memory cells selected from memory cell array 210 during a first interval of a write operation. Write circuit 230 writes the second internal data (e.g., second set data) in another nonvolatile memory cell selected from the memory cell array 210 during a second interval of the write operation.

The write circuit 230 includes encoder 234 receiving 3-bit external data, converting the received 3-bit external data such that it is mapped to two nonvolatile memory cells and outputting the internal data. Write driver 232 receives the internal data and supplies a write current corresponding to the internal data to the nonvolatile memory cells. Read circuit 250 supplies a first read current to a nonvolatile memory cell to be read to check whether the internal data stored in the nonvolatile memory cell is first internal data. Read circuit 250 supplies a second read current to the nonvolatile memory cell to be read to check whether the internal data stored in the nonvolatile memory cell is third internal data. Read circuit 250 includes sense amplifier 252 that reads internal data from the plurality of nonvolatile memory cells. Decoder 254 receives the read internal data, converts the same into 3-bit external data and outputs the same. Data MUX 256 multiplexes the 3-bit external data supplied from decoder 254 and outputs the same to data output driver 260.

The mapping operations of encoder 234 and decoder 254 will be described where the number (n) of bits of external data and number (m) of bits of the internal data supplied from encoder 234 during a write operation. The relationship between the number (n) of bits of external data and the number (k) of bits of internal data are supplied from decoder 254 during a read operation. When n is a multiple of 3 (t=n/3, where t is an integer), m=2t, and k=2m. When n is not a multiple of 3, t=[n/3] where [ ] denotes rounding-up), m=2t, and k=2m. In particular, since 3-bit external data is mapped into two phase change memory cells during a write operation, encoder 234 maps the 3-bit external data to 2-bit internal data. For example, 6-bit external data corresponds to 4-bit internal data.

In addition, in order to read data stored in a phase change memory cell during a read operation, the data is read through two read operations during a block corresponding to two internals. Sense amplifier 252 generates as many bits of internal data as twice the number of phase change memory cells. For example, in order to store data in 4 phase change memory cells, sense amplifier 252 supplies 8-bit internal data to decoder 254 and decoder 254 receives the 8-bit internal data and outputs 6-bit external data. Additional examples are summarized in Table 6.

TABLE 6

| Case | Number (n) of bits of external data | Number (m) of bits of internal data (Write operation) | Number (k) of bits of internal data (Read operation) |
|---|---|---|---|
| 1 | 8 | 6 | 12 |
| 2 | 16 | 12 | 24 |
| 3 | 18 | 12 | 24 |

In this manner, the nonvolatile memory device having 3-level nonvolatile memory cells can increase the integration degree by storing more than one bit in a nonvolatile memory cell. In addition, data can be selectively written through a write-verify operation, thereby improving write operation reliability. Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. An operating method of a nonvolatile memory device comprising:
   providing a memory cell array having first through third nonvolatile memory cells, each of said memory cells capable of storing one among first through third data corresponding to first through third resistance levels where each resistance level is different from one another;
   writing the first data in the first nonvolatile memory cell during a first interval of a write operation;
   writing the third data in the third nonvolatile memory cell during the first interval of the write operation; and
   writing the second data in the second nonvolatile memory cell during a second interval of the write operation.

2. The operating method of claim 1, wherein the first resistance level is the lowest resistance level and the third resistance level is the highest level among the three resistance levels.

3. The operating method of claim 1, wherein the writing of at least one of the first data and the third data during the first interval of the write operation is performed through a write-verify operation.

4. The operating method of claim 3, wherein the writing of the second data during the second interval of the write operation is performed through a write-verify operation.

5. The operating method of claim 1, wherein the first data is set data and the second data is first reset data and the third data is second reset data.

6. The operating method of claim 5, wherein the writing of the third data during the first interval of the write operation is performed through a write-verify operation, and the writing of the second data during the second interval of the write operation is performed through a write-verify operation.

7. The operating method of claim 1, wherein the first data is first set data and the second data is second set data and the third data is reset data.

8. The operating method of claim 7, wherein the writing of the first data during the first interval of the write operation is performed through a write-verify operation, and the writing of the second data during the second interval of the write operation is performed through a write-verify operation.

9. The operating method of claim 1, wherein each of the nonvolatile memory cells is a phase change memory cell.

10. An operating method of a nonvolatile memory device, comprising:
    providing a plurality of nonvolatile memory cells, each of said memory cells storing one among first data through third data corresponding to first through third resistance levels, respectively, each of said resistance levels different from one another where first resistance level is the lowest level and the third resistance level is the highest level among the three resistance levels;
    setting a cell type of each of the plurality of nonvolatile memory cells as a 2-level memory cell; and
    writing first data in one nonvolatile memory cell selected from the memory cell array, and writing third data in another nonvolatile memory cell selected from the memory cell array during a first interval of the write operation.

11. The operating method of claim 10, wherein during the first interval of the write operation, at least one of the writing of the first data and the writing of the third data is performed through a write-verify operation.

12. The operating method of claim 10, further comprising determining whether reset data or set data is to be used in multilevels.

13. The operating method of claim 12, wherein when the reset data is used in multilevels, the first data is set data and the second data is first reset data and third data is second reset data.

14. The operating method of claim 12, wherein when the set data is used in multilevels, the first data is first set data, the second data is second set data and the third data is reset data.

15. An operating method of a nonvolatile memory device, comprising:
    providing a plurality of nonvolatile memory cells, each of said memory cells storing one among first data through third data corresponding to first through third resistance levels, respectively, each of said resistance levels different from one another where first resistance level is the lowest level and the third resistance level is the highest level among the three resistance levels;
    setting a cell type of each of the plurality of nonvolatile memory cells as a 3-level memory cell;
    writing first data in one nonvolatile memory cell selected from the memory cell array and writing third data in another nonvolatile memory cell selected from the memory cell array during a first interval of the write operation.

16. The operating method of claim 15, further comprising:
    writing second data in still another nonvolatile memory cell selected from the memory cell array during a second interval of the write operation.

17. The operating method of claim 16, wherein during the first interval of the write operation, at least one of the writing of the first data and the writing of the third data is performed through a write-verify operation.

18. The operating method of claim 16, wherein the writing of the second data during the second interval of the write operation is performed through a write-verify operation.

19. The operating method of claim 15, further comprising determining whether reset data or set data is to be used in multilevels.

20. The operating method of claim 19, wherein when the reset data is used in multilevels, the first data is set data, the second data is first reset data and third data is second reset data.

21. The operating method of claim 19, wherein when the set data is used in multilevels, the first data is first reset data, second data is second reset data, and third data is reset data.

22. An operating method of a nonvolatile memory device comprising:
- providing a plurality of nonvolatile memory cells, each of said cells capable of storing one among first data through third data corresponding to first through third resistance levels, respectively, the first resistance level being the lowest resistance level and the third resistance level being the highest level from among the three resistance levels;
- supplying a first read current to the nonvolatile memory cell to determine whether the data stored in the nonvolatile memory cell is first data; and
- supplying a second read current to the nonvolatile memory cell to determine whether the data stored in the nonvolatile memory cell is third data.

23. The operating method of claim 22, wherein the first read current is a current corresponding to a resistance level between the first resistance level and the second resistance level.

24. The operating method of claim 22, wherein the second read current is a current corresponding to a resistance level between the second resistance level and the third resistance level.

25. The operating method of claim 22, wherein the first data is set data, the second data is first reset data and the third data is second reset data.

26. The operating method of claim 22, wherein the first data is first set data, second data is second set data and the third data is reset data.

27. A nonvolatile memory device comprising:
- a memory cell array having first through third nonvolatile memory cells, each of said memory cells capable of storing one among first data through third data corresponding to first through third resistance levels, respectively, wherein the first resistance level is a lowest of the first through third resistance levels and the third resistance level is a highest of the first through third resistance levels; and
- a write circuit connected to said memory cell array and configured to write the first data and the third data in the first and third nonvolatile memory cells, respectively, during a first interval of a write operation, said write circuit further configured to write the second data in the second nonvolatile memory cell during a second interval of the write operation.

28. The nonvolatile memory device of claim 27, wherein the write circuit comprises:
- an encoder configured to receive 3-bit external data and converting the received 3-bit external data so that the data is mapped to two nonvolatile memory cells, said encoder further configured to output the internal data; and
- a write driver connected to said encoder and configured to receive the internal data and supplying a write current corresponding to the internal data to the nonvolatile memory cells.

29. A nonvolatile memory device comprising:
- a memory cell array having a plurality of nonvolatile memory cells, each of said memory cells capable of storing one among first data through third data corresponding to first through third resistance levels, respectively, each of said resistance levels being different from one another, the first resistance level being the lowest resistance level and the third resistance level being the highest resistance level among the three resistance levels; and
- a read circuit connected to said array and configured to read internal data stored in the plurality of nonvolatile memory cells, the read circuit configured to supply a first read current to the nonvolatile memory cell to be read to determine whether the internal data stored in the nonvolatile memory cell is first internal data, said read circuit configured to supply a second read current to the nonvolatile memory cell to be read to determine whether the internal data stored in the nonvolatile memory cell is third internal data.

30. The nonvolatile memory device of claim 29, wherein the read circuit comprises:
- a sense amplifier configured to read internal data from the plurality of nonvolatile memory cells; and
- a decoder configured to receive the internal data and converting the read internal data into 3-bit external data outputting the same.

* * * * *